United States Patent [19]

Screven et al.

[11] Patent Number: 5,308,943
[45] Date of Patent: May 3, 1994

[54] CONVERTIBLE HYBRID TOUCH BUTTON SWITCH

[75] Inventors: Christopher P. Screven, Torrington; Bruce P. Swaybill, Farmington, both of Conn.

[73] Assignee: Otis Elevator Company, Farmington, Conn.

[21] Appl. No.: 997,052

[22] Filed: Dec. 28, 1992

[51] Int. Cl.$^5$ .......................................... H01H 13/14
[52] U.S. Cl. .................... 200/521; 200/327; 200/600; 341/33; 341/34; 341/27
[58] Field of Search ............... 200/521, 520, 537, 292, 200/318, 327, 341, 600, 5 R; 341/33, 34, 27, 20; 340/706; 178/18, 19, 20; 361/288, 397, 399, 412, 415, 417; 192/131 R; 29/622; 361/397, 399, 412, 415, 417

[56] References Cited

U.S. PATENT DOCUMENTS

| | | | |
|---|---|---|---|
| 3,881,313 | 5/1975 | Kauling | 200/327 X |
| 4,550,310 | 10/1985 | Yamaguchi et al. | 341/33 X |
| 5,036,321 | 7/1991 | Leach et al. | 341/33 |
| 5,039,832 | 8/1991 | Polacek et al. | 200/600 X |

*Primary Examiner*—Glenn T. Barrett
*Attorney, Agent, or Firm*—Melvin P. Williams

[57] ABSTRACT

A touch button switch includes a body (10) having a conductive actuator (28) slidable from one end against a surface (62) to actuate a switch (61) on a board (52) which is held in place by hook latches (53) engaging mortises (55) in the circuit board. The surface (62) may provide conduction from the touch pad to electronic motionless switch circuitry (66) so that the touch button is usable either as a tactile switch touch button, as a motionless touch button, or both. Or, the actuator can be blocked from sliding by means of a spacer (68); and the switch (61) may be replaced by a structure (61a) holding an electrically conductive surface (62a), or not: either way, the touch button will then operate only as a motionless touch button. Or, the surface (62) can be disconnected (65) from the circuit (66), or the circuit (66) can be not installed, to operate only as a tactile switch touch button.

4 Claims, 1 Drawing Sheet

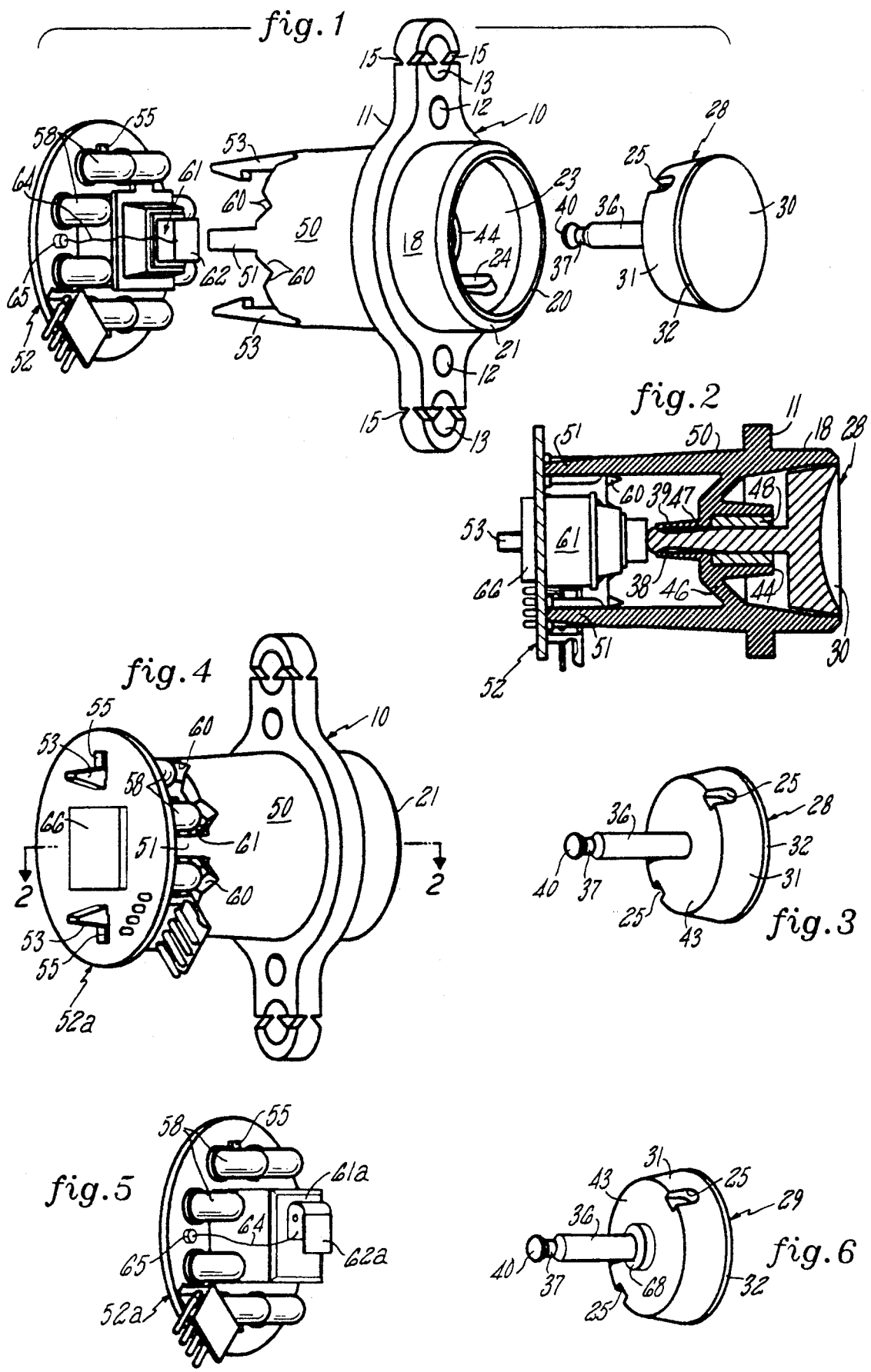

CONVERTIBLE HYBRID TOUCH BUTTON SWITCH

CROSS REFERENCE TO RELATED APPLICATION

Some of the subject matter herein is disclosed and claimed in a commonly owned, co-pending U.S. patent application of Swaybill et al entitled "Illuminated Touch Button Switch", filed contemporaneously herewith, U.S. Ser. No. 07/997,059.

TECHNICAL FIELD

This invention relates to touch button switches of the type commonly used for passenger call buttons in elevator systems.

BACKGROUND ART

It is known in elevator systems to use touch button switches for hall call switches by means of which passengers call elevators for service at a floor of a building, as well as for car call buttons by means of which passengers within the elevator select a floor at which they wish the car to stop. The call buttons may either comprise tactile switches, which cause transfer of a switch armature from a normally open to a normally closed position, with or without a noticeable spring response, or they may be motionless, such as are operated by interaction with capacitance effects of a human body member. Early call buttons included a lamp to illuminate the entire touch pad following actuation of the switch, in order to provide an indication of response to the passenger. More recently, rings of light-emitting diodes (LEDs) have been used to illuminate a ring surrounding the touch pad in order to provide the response indication.

On the one hand, many building designers and other elevator customers demand motionless, such as capacitive, touch buttons for use as elevator call buttons because of the aesthetics—the architectural elegance associated with lack of motion. However, the capacitance effect of a motionless touch button is not satisfied if the user does not make good electrical contact with touch pad, which occurs frequently when the users are wearing gloves. Furthermore, depending upon the application and the locality, motionless touch buttons violate safety codes in many cases. This is principally because of the need for visually handicapped persons to achieve a non-visual response as assurance that switching has occurred as a consequence of having touched the touch button. Therefore, tactile response is frequently required, which is most often satisfied with mechanical switches. In crowded elevator cars, the visual response provided by lighting the touch pad or a ring around the touch pad is frequently obscured by other passengers. Because of these conflicting requirements, it is common therefore to have a single elevator model or style of elevator cab and operating panel to be provided with different touch buttons, depending on the nature and location of their intended use. This further requires having two different types of touch button spare parts in inventory for maintenance.

Touch buttons of the prior art have been relatively quite expensive, either having complex mechanisms to accommodate microdot switches or the like, or having large circuit boards to accommodate motionless (for instance, capacitance) actuation. While many improvements have been made in touch buttons of the type used in elevators, many of the aforementioned difficulties remain. A touch button of this type is disclosed in U.S. Pat. No. 5,039,832.

DISCLOSURE OF INVENTION

Objects of the invention include provision of a touch button of the type which can be used as a call button in an elevator system, that is readily configured as a tactile switch touch button or as a motionless touch button, for which in a single configuration can be readily altered for operation either as a tactile switch push button, or as a motionless push button, or as both.

According to a first aspect of the present invention, a touch button includes a conductive actuator which is slidable against an electrically conductive surface of a switch, the movement of said surface in response to sliding of said actuator causing the closure of a normally open contact within said switch, said surface being electrically connected to electronic motionless switch circuitry responsive to the touching of said actuator by a human body member, whereby said touch button operates both as a motionless switch and a tactile switch. According to this aspect of the invention further, said conductive surface can be disconnected from said electronic motionless switch circuitry, whereby said touch button operates only as a tactile switch. In further accord with this aspect of the invention, said actuator can be prevented from sliding, whereby said touch button operates only as a motionless switch.

In accordance with another aspect of the invention, a touch button comprises a main body receiving an actuator in a proximal end thereof and having stops and hook latches extending longitudinally from a distal end thereof, and there are provided two circuit boards, either one of which can be snapped onto said body in contact with said stops and secured by said hook latches, one of said circuit boards having a tactile switch and the other of said circuit boards having electronic motionless switch circuitry and an electric contact, whereby said touch button is convertible for use as a tactile switch or for use as a motionless switch.

The invention provides a touch button, of the type commonly used for call buttons in elevator systems, which can include both or either of tactile switch operation or motionless switch operation. The invention permits use of tactile touch button switches which are more easily operated because of also having a motionless touch button capability, provides a touch button switch which nonetheless can be used when body members are insulated such as by the wearing of gloves, provides an aesthetic motionless switch which however can meet the code requirements for a tactile switch for the visually impaired, is convertible from one to the other, and can be adjusted to operate only as one or the other, with a very simple exchange of parts, or by simply blocking the usage of one or the other of the parts.

Other objects, features and advantages of the present invention will become more apparent in the light of the following detailed description of exemplary embodiments thereof, as illustrated in the accompanying drawing.

BRIEF DESCRIPTION OF THE DRAWINGS

FIG. 1 is an exploded perspective view of a touch button in accordance with the present invention employing a switch;

FIG. 2 is a sectioned top view of a touch button taken on the line 2-2 in FIG. 4;

FIG. 3 is a perspective view of an actuating member of the touch button of FIGS. 1 and 2;

FIG. 4 is a perspective view of a completely assembled touch button in accordance with the present invention;

FIG. 5 is a front perspective view of a circuit board for a touch button of the invention not employing a switch; and FIG. 6 is a perspective view of an actuating member adapted for motionless operation.

BEST MODE FOR CARRYING OUT THE INVENTION

Referring to the drawing, the touch button of the invention includes a generally cylindrical, hollow main body portion 10 having a flange 11 with mounting holes 12, 13 therethrough to permit mounting the touch button to a panel with screws or studs. The flange is provided with notches 15 to facilitate twisting off the ends of the flange near the holes 13, thereby to permit stacking of touch buttons on common screws or studs, if desired.

A proximal portion 18 of the body 10 has an essentially cylindrical outer surface of a constant diameter, to permit inserting the proximal end 18 of the body 10 through a hole in a panel, with a close fit which will leave a pleasing appearance. The proximal end 18 has a circular flat edge 20 and a beveled edge 21, through both of which light will be emitted in a manner described hereinafter. The proximal end 18 has an interior frustoconical surface 23 that assists in steering a maximum amount of light to the surfaces 20, 21.

A pair of ribs 24, formed integrally in the surface 23 (only one of which is shown) interact with a pair of corresponding slots 25 in a metal actuator 28, in order to correctly align the actuator 28 with respect to the panel to which the touch button is fastened, so that legends (such as "alarm") or floor numbers which may be disposed thereon have the correct vertical alignment, or to permit brushed or other aesthetic surfaces to be correctly aligned with the corresponding panel. The actuator 28 has a touch pad surface 30 which is touched by the operator in order to induce a response. The actuator 28 may have a slightly beveled surface 31 to allow it to traverse inwardly without colliding with the frustoconical surface 23 of the body 10. The actuator 28 may have a slight edge bevel for aesthetic purposes, if desired. A stem 36 includes a peripheral notch 37 that engages the minimum diameter ends of fingers 38, 39 (FIG. 2) within the body 28 which are formed by a slot in a hollow frustocone. This captures the actuator 28 while allowing it to slide outwardly until a knob 40 formed adjacent the slot 37 engages the ends of the fingers 38, 39. The actuator 28 can move inwardly until an inner surface 43 thereof (FIG. 3) engages a boss 40 (FIGS. 1 and 2) formed on a central core 46 of the member 10. The core 46 has an axial bore 47 within which the stem 36 may slide. The bore 47 may be sleeved with a bronze bushing 47, to avoid excessive wear to the body 10, if desired.

A distal portion 50 includes a pair of stops 51 with edge surfaces (not shown) against which a circuit board 52 will abut when the circuit board is secured in the position shown in FIG. 4 by means of a pair of hook latches 53 which engage the circuit board 52 through mortises 55. The hook latches 53 can be distorted outwardly slightly in order to permit passing them through the mortises 55 in the circuit board 52 as the circuit board is installed to the body 10.

A plurality of LEDs 58 are disposed in a circle on the circuit board 52 in a manner so that the centers thereof coincide essentially with the center of the wall of the distal end 50 of the body 10, each LED 58 being aligned with a pair of corresponding facets 60 formed by notches in the edge surface of the distal end 50 of the body 10. In the known manner, when the touch button has been operated and the electronics senses that fact, the electronics responds by notifying the elevator controller and illuminating the LEDs, the light from which is picked up by the facets 60 and carried along the generally cylindrical wall of the body 10 to the surface 20, 21, where the light is visible to the operator of the touch button. There may be an opaque light shield between each touch button and an adjacent touch button, such as a plastic tube slipped over the distal body portion 50, stops 5 and hook latches 53, as in said copending application.

In some embodiments, a tactile switch assembly 61 is mounted on the circuit board 52 in a position so that it can be actuated by the stem 36 whenever the touch pad 30 is pressed sufficiently to slide the actuator 28 inwardly until it hits the boss 44. The switch may be a micro dot switch or other compact tactile switch, such as an ITT Shadow, Part No. DC 61-41. The surface 62 can be an electrically conducting contact, said electrical contact being connected by a line 64 through a connector 65 to motionless circuitry 66 (FIG. 4) on the circuit board 52, so as to be able to operate the circuitry in response to capacitive effects by a body member contacting the touch pad 30, in the well-known way of capacitive sensing solid state touch button switches, as set forth completely in U.S. Pat. No. 5,036,321, the entirety of which is incorporated herein by reference. On the other hand, in place of the switch assembly 61, an electrical contact can be placed on a surface 62 which is in a position equivalent to the surface 62 of the switch 61. If the switch assembly 61 is provided with an electrically conductive pad 62, the switch can be operated both in response to capacitive effects as set forth in the '321 patent, and by pushing a little harder, by means of mechanical motion of the switch contacts within the switch assembly 61. If on the other hand, no electrical contact is provided on the surface 62 and the circuitry 66 for operating a motionless switch is not provided on the circuit board 52, then a touch button in accordance with the present invention is simply a tactile switch touch button. Or, if the contact surface 62a is provided as shown in FIG. 5, but without a tactile switch assembly 61, then the touch button of the present invention can be operated simply as a solid state, motionless touch button switch as in the aforementioned '321 patent. Yet another option is to provide the switch assembly 61 with the electrical contact on the surface 62 and with the motionless circuitry 66 of the '321 patent on the circuit board 52, and utilize the switch as either a tactile switch or as a motionless switch. By disconnecting the line 64 from the circuit board 52 at the connector 65, or insulating the contact 62 from the actuator 28, the touch button operates simply as a tactile switch. Or, the same switch can be provided with a spacer 68 (FIG. 4) which prevents the actuator 28 from being moved inwardly at all, the spacer 65 taking up all the space between the surface 43 of the actuator 28 and the boss 44 (FIG. 2) in the core of the body 10, so the touch button will operate only as a motionless switch, even though the switch assembly 61 is still in place.

Thus, the present touch button can be used as only a tactile switch touch button, or as only a motionless touch button, or as both a tactile switch and a motionless touch button, or as a touch button having both tactile switch and motionless capabilities, but capable of being operated in only one or the other fashion, in an easily effected way. Thus, the touch button in accordance with the present invention is extremely versatile. In one of the aforementioned options, it is possible to mount the motionless capacitive sensing circuitry on an additional circuit board (separately from the normal response circuitry and the LEDs) so as to permit providing the circuitry only if it is desired to be used. On the other hand, it may well be more economical to provide a single board, with both the motionless circuitry and the switch assembly, even though it may be used in either tactile-only or motionless-only applications. This would permit use of a single board for repairing touch buttons of any of the aforementioned types, while storing only one part number for spares. That is to say, the additional cost of a circuit board having both the switch assembly and the touch button capacitive sensing electronic circuitry thereon is likely to be less than the savings resulting from having a single circuit board 52 which accommodates any of the aforementioned options. This is particularly true where the circuitry is formulated in integrated circuit fashion, rather than with discrete units on a printed circuit board. Such an integrated circuit 66 may instead by fitted into the structure 61a; or the circuits may be distributed around the board.

Thus, although the invention has been shown and described with respect to exemplary embodiments thereof, it should be understood by those skilled in the art that the foregoing and various other changes, omissions and additions may be made therein and thereto, without departing from the spirit and scope of the invention.

We claim:

1. A hybrid touch button, comprising:
   a generally cylindrical body having proximal and distal ends, and having a bore axially disposed between said ends;
   an electrically conductive actuator having a touch pad at a proximal end and a stem at a distal end, said actuator disposed to slide within said body with said stem being located within said bore between a proximal position with said touch pad near said proximal end of said body and a distal position with said touch pad located inward of said proximal end of said body; and
   a circuit board having an electronic motionless switch circuit disposed thereon, and having a switch assembly disposed thereon, said switch assembly including a tactile switch with an electrically conductive switch actuating surface in contact with said actuator when said actuator is in any position to which it can slide, said tactile switch being operable by sliding said actuator to said distal position, said surface electrically connected with said circuit, whereby switching action is achieved by touching said touch pad or by sliding said actuator, or both.

2. A method of providing a tactile touch button switch, comprising:
   providing a hybrid touch button that includes:
   a generally cylindrical body having proximal and distal ends, and having a bore axially disposed between said ends; an electrically conductive actuator having a touch pad at one end and a stem at another end, said actuator disposed to slide within said body with said stem being located within said bore between a proximal position with said touch pad near said proximal end and a distal position with said touch pad located inward of said proximal end; a circuit board having an electronic motionless switch circuit disposed thereon, and having a switch assembly disposed thereon, said switch assembly including a tactile switch with an electrically conductive switch actuating surface in contact with said actuator when said actuator is in any position, to which it can slide, said tactile switch being operable by sliding said actuator to said distal position, said surface electrically connected with said circuit, whereby switching action is achieved by touching said touch pad or by sliding said actuator, or both; and
   disconnecting said surface from said circuit.

3. A method of providing a motionless touch button switch, comprising:
   providing a hybrid touch button that includes:
   a generally cylindrical body having proximal and distal ends, and having a bore axially disposed between said ends; an electrically conductive actuator having a touch pad at one end and a stem at another end, said actuator disposed to slide within said body with said stem being located within said bore between a proximal position with said touch pad near said proximal end and a distal position with said touch pad inward of said proximal end; a circuit board having an electronic motionless switch circuit disposed thereon, and having a switch assembly disposed thereon, said switch assembly including a tactile switch with an electrically conductive switch actuating surface in contact with said actuator when said actuator is in any position to which it can slide, said tactile switch being operable by sliding said actuator to said distal position, said surface electrically connected with said circuit, whereby switching action is achieved by touching said touch pad or by sliding said actuator, or both; and
   providing a spacer to prevent said actuator from sliding.

4. A method of providing a touch button, comprising:
   providing a generally cylindrical body having a proximal end, having a plurality of hook latches extending longitudinally outward from a distal end thereof, having at least one stop surface near said distal end, having a bore axially disposed between said ends, and having an electrically conductive actuator with a touch pad at a proximal end and a stem at a distal end slidably disposed within said body with said stem being located within said bore and said touch pad being located near said proximal end;
   providing a first circuit board having a tactile switch disposed thereon for operation by sliding said actuator and having a mortise for each of said hook latches, said circuit board being able to be mounted on said body, so that said actuator can operate said switch, by being urged against said stop surface with said hook latches extending through said mortises and engaging said circuit board;

providing a second circuit board having an electronic motionless switch circuit and having an electrically conductive surface disposed on said circuit board to provide connection between said actuator and said circuit, and having a mortise for each of said hook latches, said second circuit board being able to be mounted on said body, with said actuator in electrical contact with said surface, by being urged against said stop surface with said hook latches extending through said mortises and engaging said circuit board; and mounting one of said first circuit board and said second circuit board on said body.

* * * * *